United States Patent
Kwon et al.

(10) Patent No.: US 9,294,086 B2
(45) Date of Patent: Mar. 22, 2016

(54) STAGE CIRCUIT AND SCAN DRIVER USING THE SAME

(71) Applicants: Samsung Display Co., Ltd., Yongin, Gyeonggi-do (KR); Industry-University Cooperation Foundation Hanyang-University, Seoul (KR)

(72) Inventors: Oh-Kyong Kwon, Seoul (KR); Yeong-Keun Kwon, Yongin (KR); Jong-Hee Kim, Yongin (KR); Ji-Sun Kim, Yongin (KR); Jae-Keun Lim, Yongin (KR); Chong-Chul Chai, Yongin (KR)

(73) Assignees: Samsung Display Co., Ltd., Yongin-si (KR); Industry-University Cooperation Foundation Hanyang-University, Seoul (KR)

( * ) Notice: Subject to any disclaimer, the term of this patent is extended or adjusted under 35 U.S.C. 154(b) by 29 days.

(21) Appl. No.: 14/456,995

(22) Filed: Aug. 11, 2014

(65) Prior Publication Data
US 2015/0042383 A1 Feb. 12, 2015

(30) Foreign Application Priority Data
Aug. 12, 2013 (KR) .......................... 10-2013-0095211

(51) Int. Cl.
*H03K 3/00* (2006.01)
*H03K 17/687* (2006.01)
(Continued)

(52) U.S. Cl.
CPC ............ *H03K 17/687* (2013.01); *G09G 3/3266* (2013.01); *G11C 19/184* (2013.01); *G11C 19/28* (2013.01); *G09G 2310/0286* (2013.01); *G09G 2310/06* (2013.01)

(58) Field of Classification Search
CPC ....... G09G 5/001; G09G 3/36; G09G 3/3696; G09G 3/14; G09G 3/3225; H03K 17/693; H03K 17/687; H03K 17/06
USPC ............ 327/108–112, 427, 434, 437; 326/82, 326/83, 87; 345/212, 87, 204, 213, 82, 211, 345/209, 98
See application file for complete search history.

(56) References Cited

U.S. PATENT DOCUMENTS

| | | | | |
|---|---|---|---|---|
| 7,221,197 B2 * | 5/2007 | Morita | ................. | G09G 3/3677 327/112 |
| 2010/0134399 A1 * | 6/2010 | Ki | ........................ | G09G 3/3677 345/94 |

(Continued)

FOREIGN PATENT DOCUMENTS

| KR | 10-2012-0060298 A | 6/2012 |
|---|---|---|
| KR | 10-2013-0012392 A | 2/2013 |

(Continued)

OTHER PUBLICATIONS

Binn Kim et al., New Depletion-Mode IGZO TFT Shift Register, Electron Device Letters, Feb. 2011, 2 Pages, vol. 32, Issue 2, IEEE, http://ieeexplore.ieee.org/xpl/articleDetails.jsp?arnumber=5671460.

*Primary Examiner* — Lincoln Donovan
*Assistant Examiner* — Thomas Skibinski
(74) *Attorney, Agent, or Firm* — Lewis Roca Rothgerber Christie LLP

(57) ABSTRACT

A stage circuit includes a first driver, a second driver, a first output unit and a second output unit. The first driver controls voltages of first and second nodes, according to a first power source, a start signal or a carry signal of a previous stage supplied to a first input terminal, a first clock signal supplied to a second input terminal, and a second clock signal supplied to a third input terminal. The second driver controls a voltage of a third node, according to the first power source, a start signal or a carry signal of a previous stage supplied to a first input terminal, a carry signal of a next stage supplied to a fourth input terminal, and the voltage of the second node.

21 Claims, 10 Drawing Sheets

(51) Int. Cl.
*G09G 3/32* (2006.01)
*G11C 19/18* (2006.01)
*G11C 19/28* (2006.01)

(56) References Cited

U.S. PATENT DOCUMENTS

| | | | |
|---|---|---|---|
| 2012/0139883 A1 | 6/2012 | Lee et al. | |
| 2013/0002306 A1* | 1/2013 | Chung | G09G 3/3266 327/108 |
| 2013/0002630 A1* | 1/2013 | Lee | G09G 3/3266 345/211 |
| 2013/0120346 A1* | 5/2013 | Chung | G09G 5/00 345/212 |
| 2013/0141318 A1 | 6/2013 | Kim et al. | |
| 2014/0092078 A1 | 4/2014 | Yoon et al. | |
| 2015/0029169 A1* | 1/2015 | Song | G09G 3/3266 345/212 |
| 2015/0042638 A1* | 2/2015 | Kwon | G09G 3/3266 345/213 |

FOREIGN PATENT DOCUMENTS

| | | |
|---|---|---|
| KR | 10-2013-0028274 A | 3/2013 |
| KR | 10-2014-0042308 A | 4/2014 |

\* cited by examiner

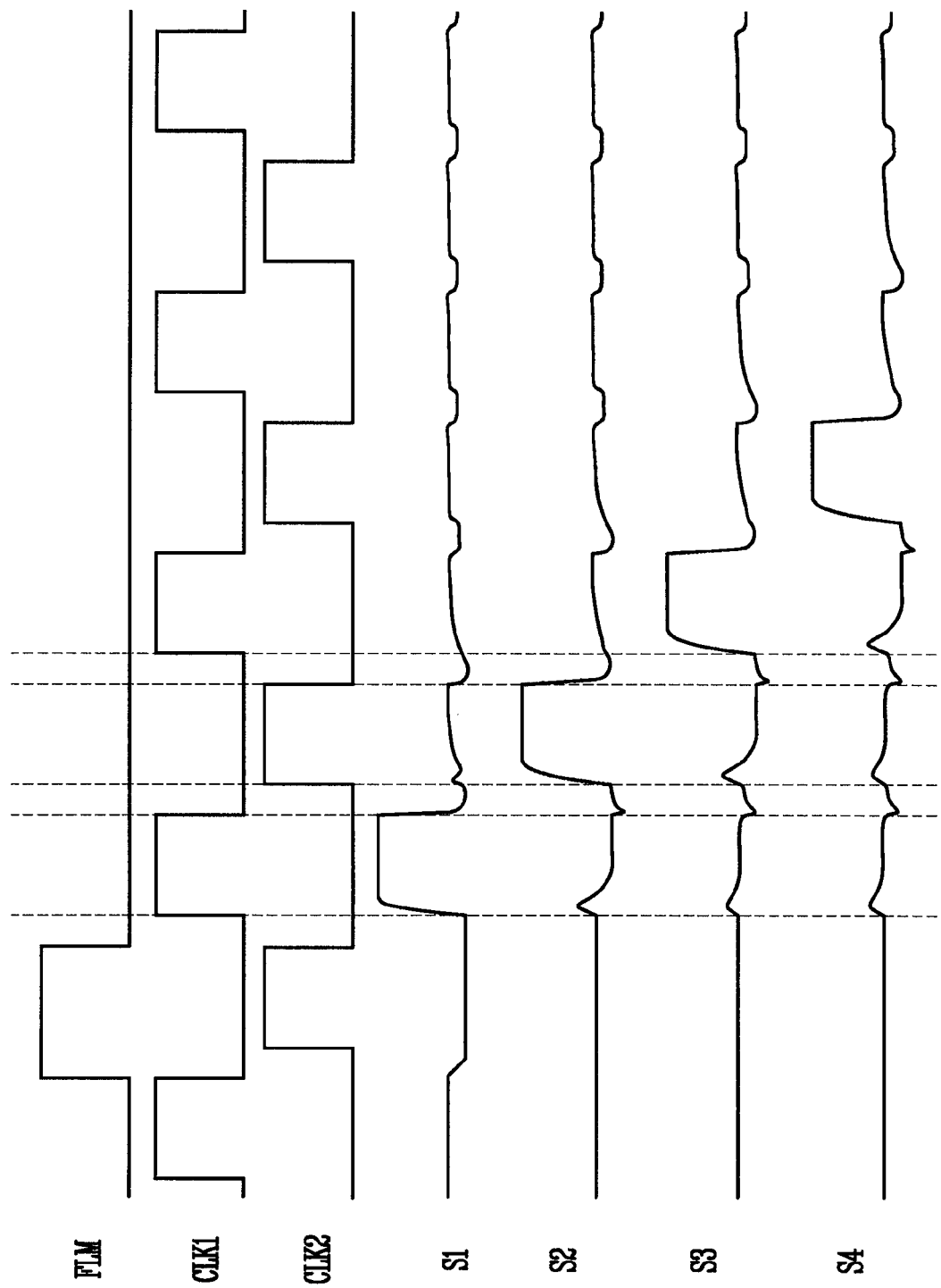

STAGE CIRCUIT AND SCAN DRIVER USING THE SAME

CROSS-REFERENCE TO RELATED APPLICATION

This application claims priority to and the benefit of Korean Patent Application No. 10-2013-0095211, filed on Aug. 12, 2013, in the Korean Intellectual Property Office, the entire contents of which are incorporated herein by reference in their entirety.

BACKGROUND

1. Field

Embodiments of the present invention relate to a stage circuit and a scan driver using the same.

2. Description of the Related Art

With the recent developments in information technologies, the importance of a display device that is a medium for presenting information has been increasing. Accordingly, flat panel display devices (FPD devices) such as liquid crystal display (LCD) devices, organic light emitting diode (OLED) display devices and plasma display panel (PDP) devices are being increasingly used.

Among these FPD devices, the OLED display device displays images using organic light emitting diodes (OLEDs) that emit light through recombination of electrons and holes. The organic light emitting display device has a fast response speed and is driven with low power consumption.

SUMMARY

Embodiments provide a stage circuit and a scan driver using the same, which can improve the reliability of driving an OLED display device.

According to an embodiment of the present invention, there is provided a stage circuit, including: a first driver configured to control voltages of first and second nodes, according to a first power source, a start signal or a carry signal of a previous stage supplied to a first input terminal, a first clock signal supplied to a second input terminal, and a second clock signal supplied to a third input terminal; a second driver configured to control a voltage of a third node, according to the first power source, a start signal or a carry signal of a previous stage supplied to a first input terminal, a carry signal of a next stage, supplied to a fourth input terminal, and the voltage of the second node; a first output unit configured to output a carry signal to a first output terminal, according to voltages of the second input terminal, the first power source and the second and third nodes; and a second output unit configured to output a scan signal to a second output terminal, according to voltages of a second power source, the second input terminal and the second and third nodes.

The first driver, the second driver, the first output and the second output may be configured with N-type transistors.

The first and second power sources may be set to a gate-off voltage.

The second power source may be set to a voltage higher than that of the first power source.

The second output unit may include a first transistor coupled between the second input terminal and the second output terminal, the first transistor having a gate electrode coupled to the third node; and a second transistor coupled between the second output terminal and the second power source, the second transistor having a gate electrode coupled to the second node.

The first output unit may include a third transistor coupled between the second input terminal and the first output terminal, the third transistor having a gate electrode coupled to the third node; a fourth transistor coupled between the first output terminal and the first power source, the fourth transistor having a gate electrode coupled to the second node; and a first capacitor coupled between the third node and the first output terminal.

The first driver may include a fifth transistor coupled between the second input terminal and the first node, the fifth transistor having a gate electrode coupled to the second input terminal; a sixth transistor coupled between the first and second nodes, the sixth transistor having a gate electrode coupled to the third input terminal; a seventh transistor coupled between the second node and the first power source, the seventh transistor having a gate electrode coupled to the first input terminal; an eighth transistor coupled between the second node and the first power source, the eighth transistor having a gate electrode coupled to the third node; and a second capacitor coupled between the first node and the second power source.

The second driver may include a ninth transistor coupled between the first input terminal and the third node, the ninth transistor having a gate electrode coupled to the first input terminal; a tenth transistor coupled between the third node and the first power source, the tenth transistor having a gate electrode coupled to the second node; and an eleventh transistor coupled between the third node and the first power source, the eleventh transistor having a gate electrode coupled to the fourth input terminal.

According to another embodiment of the present invention, there is provided a scan driver, including: stage circuits respectively coupled to scan lines to supply scan signals to the scan lines, wherein each stage circuit includes: a first driver configured to control voltages of first and second nodes, according to a first power source, a start signal or a carry signal of a previous stage supplied to a first input terminal, a first or second clock signal supplied to a second input terminal, and the second or first clock signal supplied to a third input terminal; a second driver configured to control a voltage of a third node, according to the first power source, a start signal or a carry signal of a previous stage supplied to a first input terminal, a carry signal of a next stage supplied to a fourth input terminal, and the voltage of the second node; a first output unit configured to output a carry signal to a first output terminal, according to voltages of the second input terminal, the first power source and the second and third nodes; and a second output unit configured to output a scan signal to a second output terminal, according to voltages of a second power source, the second input terminal and the second and third nodes.

The first and second clock signals may repeat first and second voltages, the second voltage being lower than the first voltage, and the supply period of the second voltage may be longer than that of the first voltage.

The low voltage of the clock signal may be overlapped with the high voltage of the second clock signal.

The start signal may be input to the first input terminal of a first stage circuit, and the carry signal of the previous stage may be input to the first input terminal of each of the other stage circuits.

The start signal may be overlapped with one of the first and second clock signals supplied to the third input terminal.

The first and second clock signals may be supplied to the second and third input terminals of an odd-numbered stage, respectively. The second and first clock signals may be supplied to the second and third input terminals of an even-numbered stage, respectively.

The first driver, the second driver, the first output unit and the second output unit may be configured with N-type transistors.

The first and second power sources may be set to a gate-off voltage.

The second power source may be set to a voltage higher than that of the first power source.

The second output unit may include a first transistor coupled between the second input terminal and the second output terminal, the first transistor having a gate electrode coupled to the third node; and a second transistor coupled between the second output terminal and the second power source, the second transistor having a gate electrode coupled to the second node.

The first output unit may include a third transistor coupled between the second input terminal and the first output terminal, the third transistor having a gate electrode coupled to the third node; a fourth transistor coupled between the first output terminal and the first power source, the fourth transistor having a gate electrode coupled to the second node; and a first capacitor coupled between the third node and the first output terminal.

The first driver may include a fifth transistor coupled between the second input terminal and the first node, the fifth transistor having a gate electrode coupled to the second input terminal; a sixth transistor coupled between the first and second nodes, the sixth transistor having a gate electrode coupled to the third input terminal; a seventh transistor coupled between the second node and the first power source, the seventh transistor having a gate electrode coupled to the first input terminal; an eighth transistor coupled between the second node and the first power source, the eighth transistor having a gate electrode coupled to the third node; and a second capacitor coupled between the first node and the second power source.

The second driver may include a ninth transistor coupled between the first input terminal and the third node, the ninth transistor having a gate electrode coupled to the first input terminal; a tenth transistor coupled between the third node and the first power source, the tenth transistor having a gate electrode coupled to the second node; and an eleventh transistor coupled between the third node and the first power source, the eleventh transistor having a gate electrode coupled to the fourth input terminal.

BRIEF DESCRIPTION OF THE DRAWINGS

Example embodiments will be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 6 is a diagram illustrating a simulation result of the scan driver according to an embodiment of the present invention.

DETAILED DESCRIPTION

Figure 1:
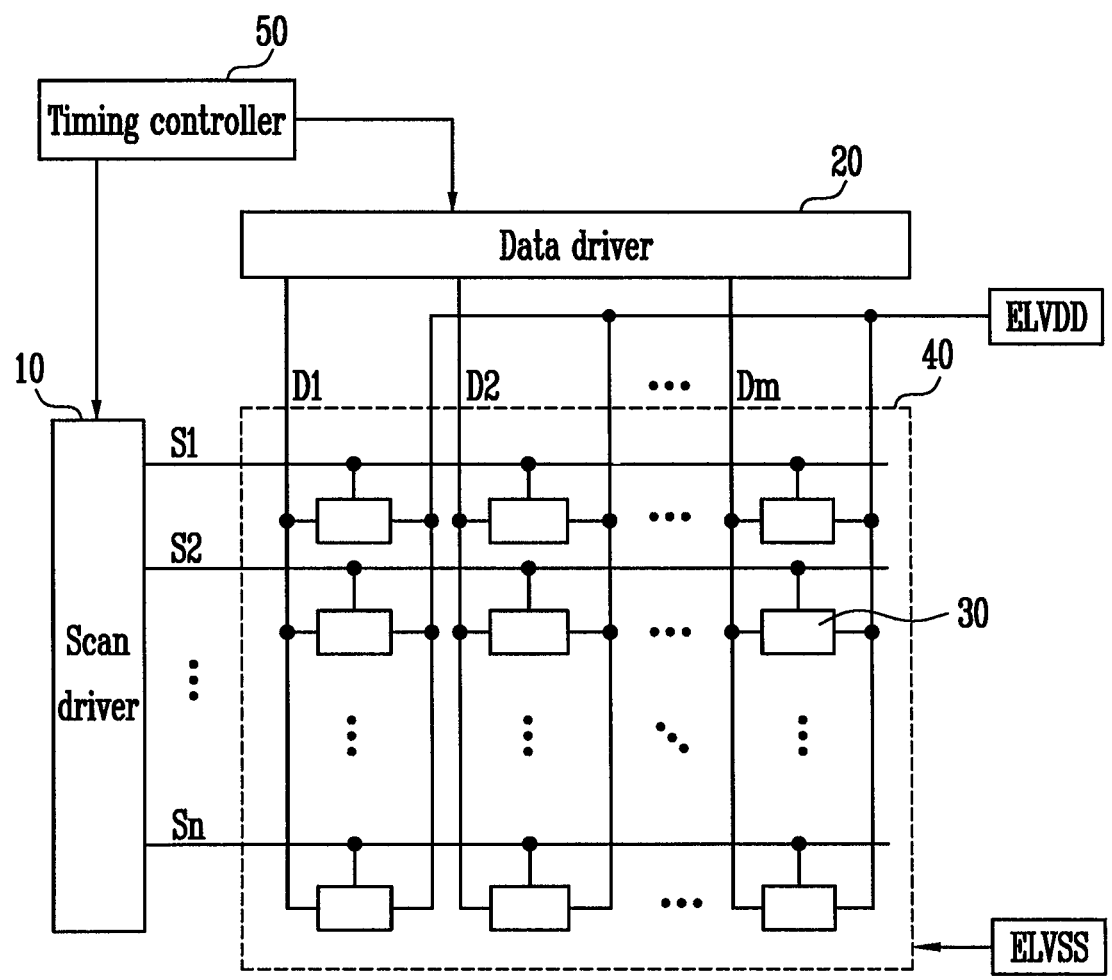
FIG. 1 is a diagram illustrating an organic light emitting display device according to an embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via a third element. Further, some of the elements that are not essential to the complete understanding of the invention are omitted for clarity. Also, like reference numerals refer to like elements throughout.

Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a diagram illustrating an organic light emitting display device according to an embodiment of the present invention.

Referring to FIG. 1, the organic light emitting display device according to this embodiment includes a display unit 40 configured to include pixels 30 positioned at crossing regions of scan lines S1 to Sn and data lines D1 to Dm, a scan driver 10 configured to drive the scan lines S1 to Sn, a data driver 20 configured to drive the data lines D1 to Dm, and a timing controller 50 configured to control the scan driver 10 and the data driver 20.

The scan driver 10 supplies scan signals to the scan lines S1 to Sn. For example, the scan driver 10 may progressively supply the scan signals to the scan lines S1 to Sn. To this end, the scan driver 10 includes stage circuits (not shown) respectively coupled to the scan lines S1 to Sn. When the scan signals are progressively supplied to the scan lines S1 to Sn, pixels 30 are selected for each horizontal line.

The data driver 20 supplies data signals to the data lines D1 to Dm in synchronization with the scan signals.

The timing controller 50 controls the scan driver 10 and the data driver 20. The timing controller 50 supplies, to the data driver 20, data (not shown) supplied from the outside of the organic light emitting display device.

Each pixel 30 stores a voltage corresponding to the data signal when the scan signal is supplied. The pixel 30 generates light (e.g. light having a predetermined luminance while controlling the amount of current supplied to an organic light emitting diode (OLED) (not shown), corresponding to the data signal.

Figure 2:
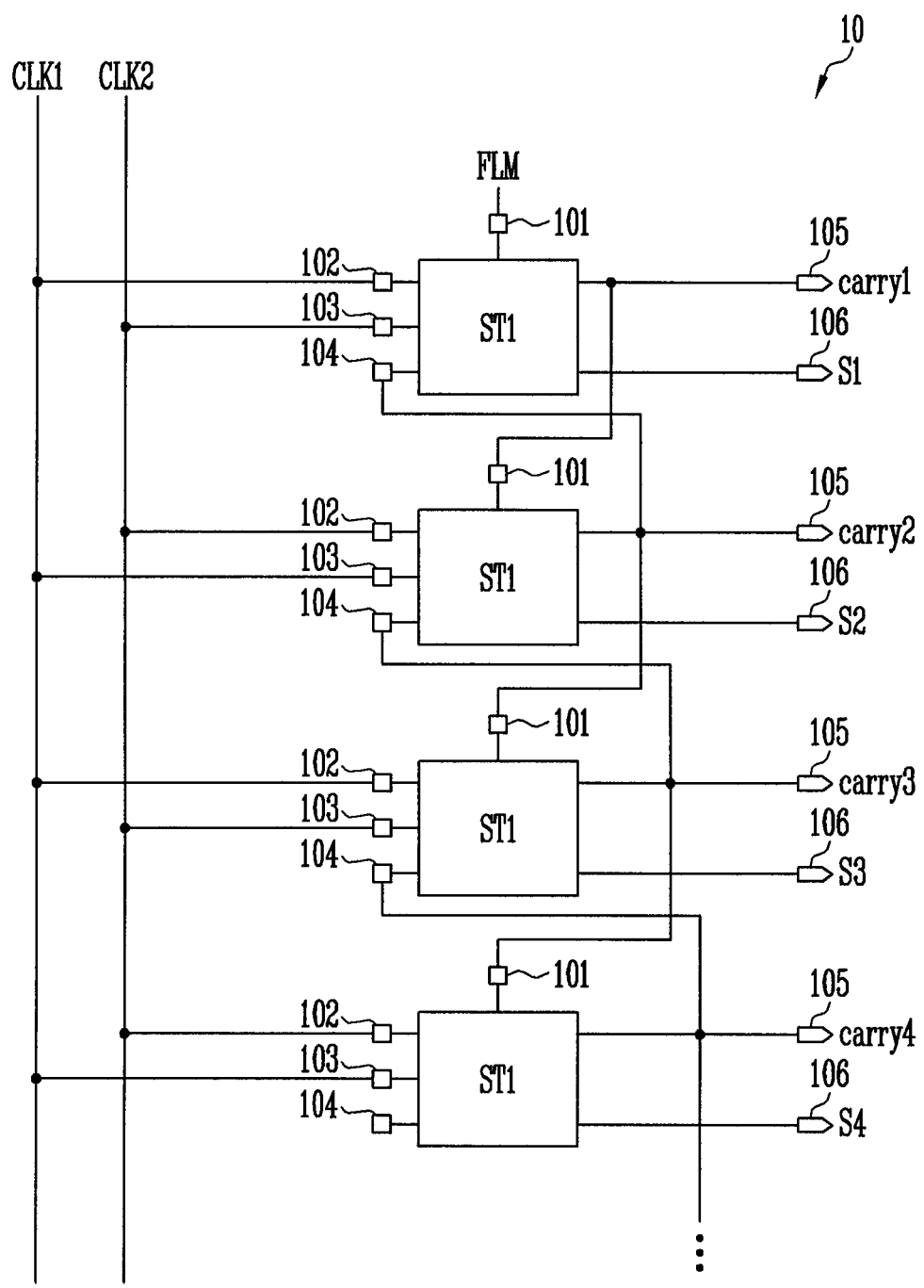
FIG. 2 is a diagram illustrating an embodiment of a scan driver shown in FIG. 1.

FIG. 2 is a diagram illustrating an embodiment of the scan driver shown in FIG. 1. For convenience of illustration, four stages are shown in FIG. 2.

Referring to FIG. 2, the scan driver 10 includes stage circuits ST1 to ST4 respectively coupled to scan lines S1 to S4. The stage circuits ST1 to ST4 include substantially the same circuit architecture as each other. The stage circuits ST1 to ST4 progressively supply scan signals to the scan lines S1 to S4. Hence, stage circuits ST1 to STn progressively supply scan signals to the scan lines S1 to Sn.

To this end, each of the stage circuits ST1 to ST4 includes a first input terminal 101, a second input terminal 102, a third input terminal 103, a fourth input terminal 104, a first output terminal 105 and a second output terminal 106.

Figure 4:
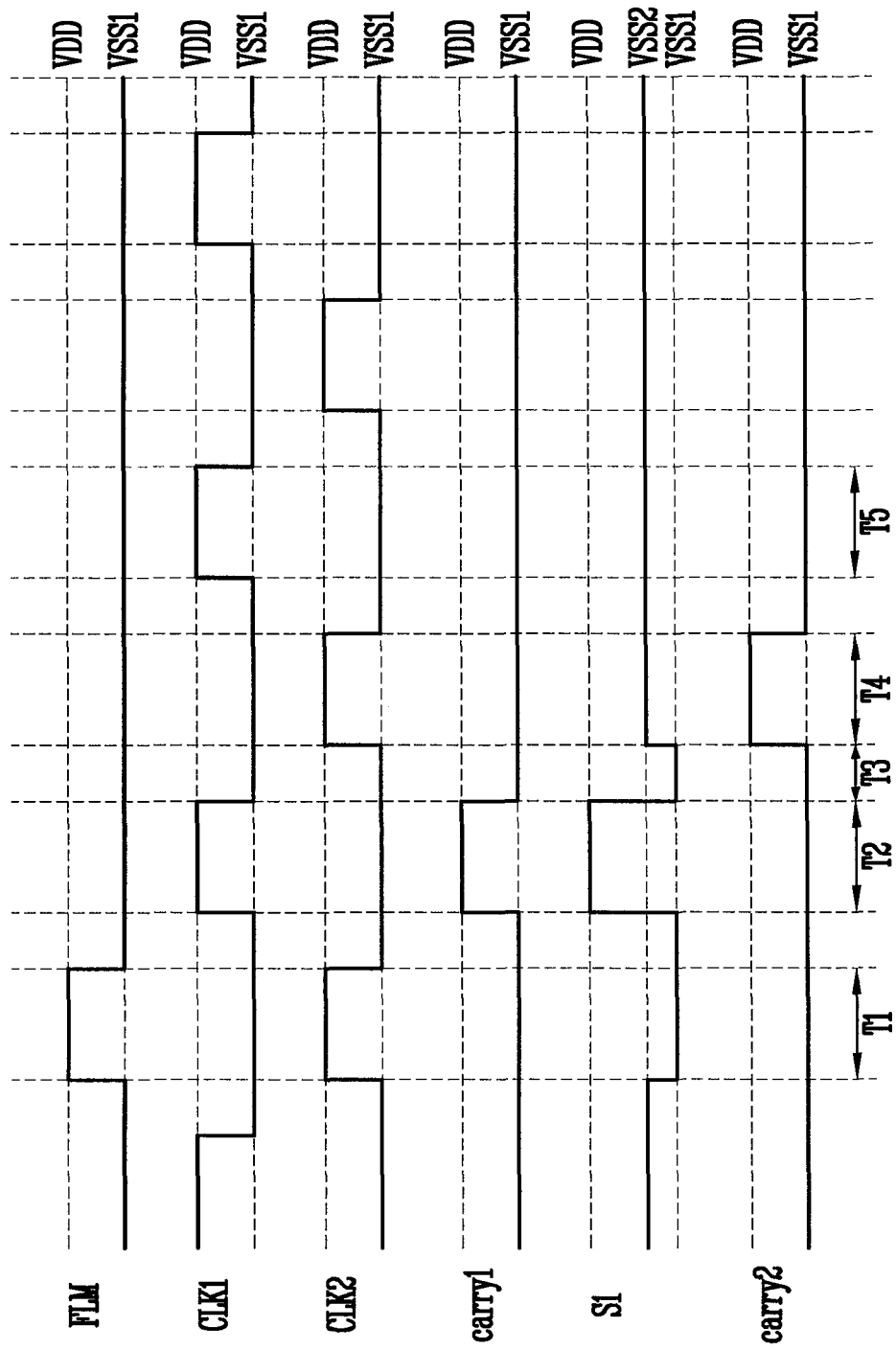
FIG. 4 is a waveform diagram illustrating an embodiment of a driving method of the stage circuit shown in FIG. 3.

A first clock signal CLK1 is supplied to the second input terminal 102 of an odd-numbered (or even-numbered) stage circuit, and a second clock signal CLK2 is supplied to the third input terminal 103 of the odd-numbered (or even-numbered) stage circuit. The second clock signal CLK2 is supplied to the second input terminal 102 of an even-numbered (or odd-numbered) stage circuit, and the first clock signal CLK1 is supplied to the third input terminal 103 of the even-numbered (or odd-numbered) stage circuit. Here, the first and second clock signals CLK1 and CLK2, as shown in FIG. 4, have the same period, and the phases of the first and second clock signals CLK1 and CLK2 are set opposite to each other.

For example, the first and second clock signals CLK1 and CLK2 repeat a high level (high voltage) and a low level (low voltage), and the supply period of the low-level voltage is set longer than that of the high-level voltage. The high-level voltage of the first clock signal CLK1 is supplied to overlap with the low-level voltage of the second clock signal CLK2. In this case, the low-level voltage of the first clock signal CLK1 is also overlapped with the low level voltage of the second clock signal during a partial period.

The first input terminal 101 included in each of the stage circuits ST1 to ST4 receives a carry signal carry of a previous stage or a start signal FLM. For example, the start signal FLM is supplied to the first input terminal 101 of the first stage circuit ST1, and the carry signal carry of the previous stage is supplied to each of the other stage circuits ST2 to ST4.

The fourth input terminal 104 included in each of the stage circuits ST1 to ST4 receives a carry signal carry of a next stage. For example, the fourth input terminal 104 of the first stage circuit ST1 receives a carry signal carry2 of the second stage circuit ST2.

The carry signal carry is output to the first output terminal 105 included in each of the stage circuits ST1 to ST4, and a scan signal to be supplied to a scan line S1 is output to the second output terminal 106 included in each of the stage circuits ST1 to ST4. Here, the carry signal and the scan signal, output from the same stage circuit are set to the same waveform.

Figure 3:
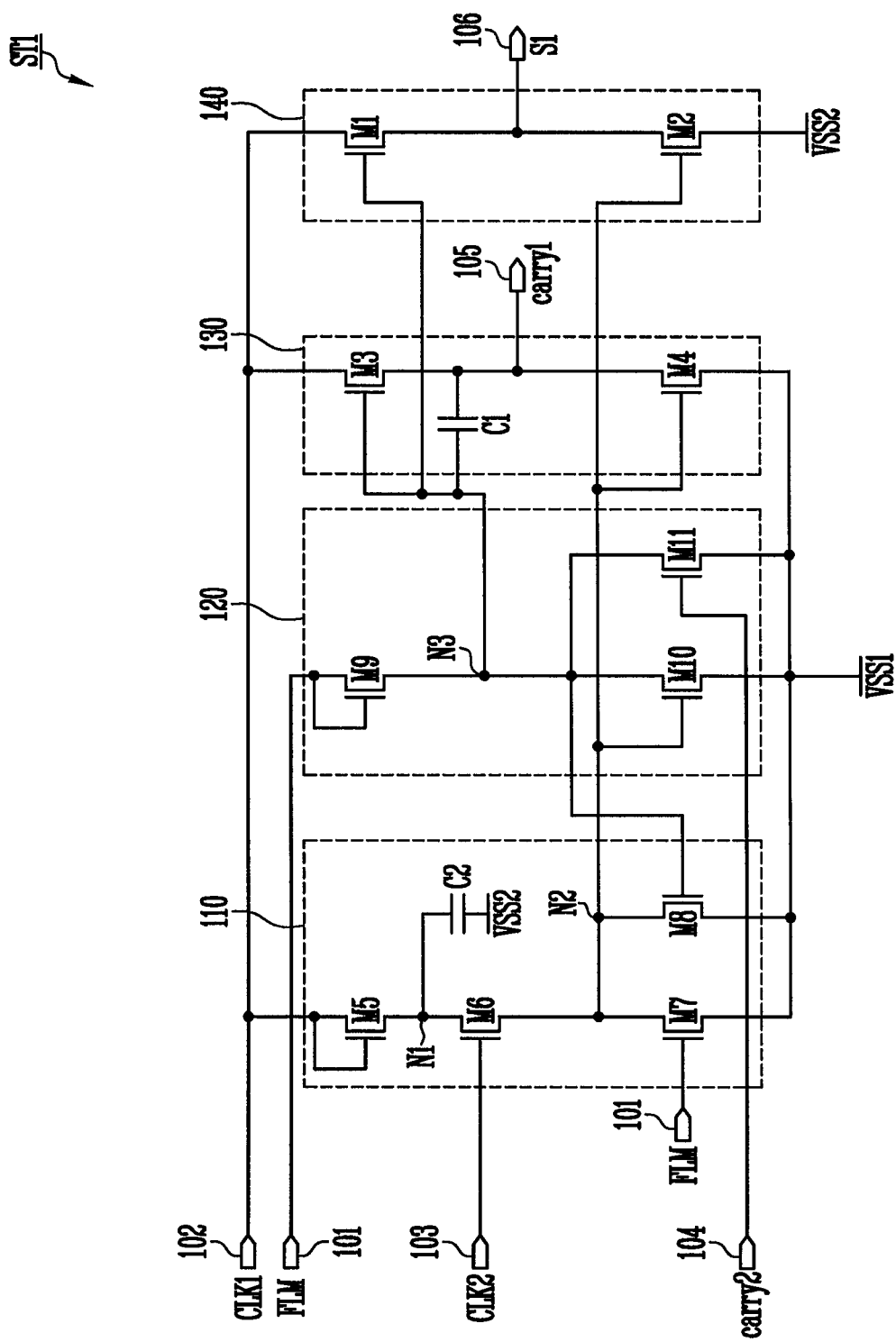
FIG. 3 is a circuit diagram illustrating an embodiment of a stage circuit shown in FIG. 2.

FIG. 3 is a circuit diagram illustrating an embodiment of the stage circuit shown in FIG. 2. For convenience of illustration, the first stage circuit ST1 will be shown in FIG. 3.

Referring to FIG. 3, the stage circuit ST1 according to this embodiment includes a first driver 110, a second driver 120, a first output unit 130 and a second output unit 140. The first driver 110, the second driver 120, the first output unit 130 and the second output unit 140 are configured with N-type transistors (e.g., NMOS transistors). In other embodiments, other suitable types of transistors (e.g., P-type transistors) may be used.

First and second power sources VSS1 and VSS2 supplied to the stage circuit ST1 are set to a gate-off voltage. The second power source VSS2 is set to a voltage higher than that of the first power source VSS1.

The second output unit 140 supplies a scan signal to the second output terminal 106, corresponding to (e.g. according to, based on, determined by, or controlled by) voltages of second and third nodes N2 and N3. To this end, the second output unit 140 includes a first transistor M1 and a second transistor M2.

The first transistor M1 is coupled between the second input terminal 102 and the second output terminal 106. A gate electrode of the first transistor M1 is coupled to the third node N3. The first transistor M1 controls the electrical coupling between the second input terminal 102 and the second output terminal 106, corresponding to (e.g. according to, based on, determined by, or controlled by) the voltage applied to the third node N3.

The second transistor M2 is coupled between the second output terminal 106 and the second power source VSS2. A gate electrode of the second transistor M2 is coupled to the second node N2. The second transistor M2 controls the coupling between the second output terminal 106 and the second power source VSS2, corresponding to the voltage applied to the second node N2. Here, the second power source VSS2 is set to a voltage higher than that of the first power source VSS1, and hence the second transistor M2 can be stably set to a turn-off state (completely turned off) when the first power source VSS1 is input to the second node N2.

The first output unit 130 outputs a carry signal carry1 to the first output terminal 105, corresponding to (e.g. according to, based on, determined by, or controlled by) voltages of the second input terminal 102, the first power source VSS1 and the second and third nodes N2 and N3. To this end, the first output unit 130 includes a third transistor M3, a fourth transistor M4 and a first capacitor C1.

The third transistor M3 is coupled between the second input terminal 102 and the first output terminal 105. A gate electrode of the third transistor M3 is coupled to the third node N3. The third transistor M3 controls the electrical coupling between the second input terminal 102 and the first output terminal 105, corresponding to (e.g. according to, based on, determined by, or controlled by) the voltage of the third node N3.

The fourth transistor M4 is coupled between the first output terminal 105 and the first power source VSS1. A gate electrode of the fourth transistor M4 is coupled to the second node N2. The fourth transistor M4 controls the coupling between the first output terminal 105 and the first power source VSS1, corresponding to (e.g. according to, based on, determined by, or controlled by) the voltage of the second node N2.

The first capacitor C1 is coupled between the third node N3 and the first output terminal 105. The first capacitor C1 controls the voltage of the third node N3, corresponding to the voltage of the first output terminal 105.

The first driver 110 controls the voltages of a first node N1 and the second node N2, corresponding to (e.g. according to, based on, determined by, or controlled by) signals supplied to the second power source VSS2, the first input terminal 101, the second input terminal 102 and the third input terminal 103. To this end, the first driver 110 includes a fifth transistor M5, a sixth transistor M6, a seventh transistor M7, an eighth transistor M8 and a second capacitor C2.

The fifth transistor M5 is coupled between the second input terminal 102 and the first node N1. A gate electrode of the fifth transistor M5 is coupled to the second input terminal 102. That is, the fifth transistor M5 is diode-coupled, and is turned on when the first clock signal CLK1 is supplied to the second input terminal 102.

The sixth transistor M6 is coupled between the first and second nodes N1 and N2. A gate electrode of the sixth transistor M6 is coupled to the third input terminal 103. The sixth transistor M6 is turned on when the second clock signal CLK2 is supplied to the third input terminal 103, to allow the first and second nodes N1 and N2 to be electrically coupled to each other.

The seventh transistor M7 is coupled between the second node N2 and the first power source VSS1. A gate electrode of the seventh transistor M7 is coupled to the first input terminal 101. The seventh transistor M7 is turned on when the start signal FLM is supplied to the first input terminal 101, to supply the voltage of the first power source VSS1 to the second node N2.

The eighth transistor M8 is coupled between the second node N2 and the first power source VSS1. A gate electrode of the eighth transistor M8 is coupled to the third node N3. The eighth transistor M8 controls the electrical coupling between the second node N2 and the first power source VSS1, corresponding to (e.g. according to, based on, determined by, or controlled by) the voltage of the third node N3.

The second capacitor C2 is coupled between the first node N1 and the second power source VSS2. The second capacitor C2 stores the voltage of the first node N1. Meanwhile, although it has been illustrated in FIG. 3 that the second capacitor C2 is coupled to the second power source VSS2, the present invention is not limited thereto. For example, the second capacitor C2 may be coupled to the first power source VSS1.

The second driver 120 controls the voltage of the third node N3, corresponding to (e.g. according to, based on, determined by, or controlled by) voltages of the first power source VSS1, the first input terminal 101, the fourth input terminal 104 and the second node N2. To this end, the second driver 120 includes a ninth transistor M9, a tenth transistor M10 and an eleventh transistor M11.

The ninth transistor M9 is coupled between the first input terminal 101 and the third node N3. A gate electrode of the ninth transistor M9 is coupled to the first input terminal 101. That is, the ninth transistor M9 is diode-coupled, and is turned on when the start signal ELM is supplied to the first input terminal 101.

The tenth transistor M10 is coupled between the third node N3 and the first power source VSS1. A gate electrode of the tenth transistor M10 is coupled to the second node N2. The tenth transistor M10 controls the electrical coupling between the third node N3 and the first power source VSS1, corresponding to (e.g. according to, based on, determined by, or controlled by) the voltage of the second node N2.

The eleventh transistor M11 is coupled between the third node N3 and the first power source VSS1. A gate electrode of the eleventh transistor M11 is coupled to the fourth input terminal 104. The eleventh transistor M11 is turned on when the carry signal carry2 is supplied to the fourth input terminal 104, to supply the voltage of the first power source VSS1 to the third node N3.

FIG. 4 is a waveform diagram illustrating an embodiment of a driving method of the stage circuit shown in FIG. 3.

Referring to FIG. 4, during a first period T1, the second clock signal CLK2 is supplied (e.g., the clock signal CLK2 is at a high level) to the third input terminal 103, and the start signal FLM is supplied (e.g., the start signal FLM is at a high level) in synchronization with the second clocks signal CLK2.

Figure 5A:
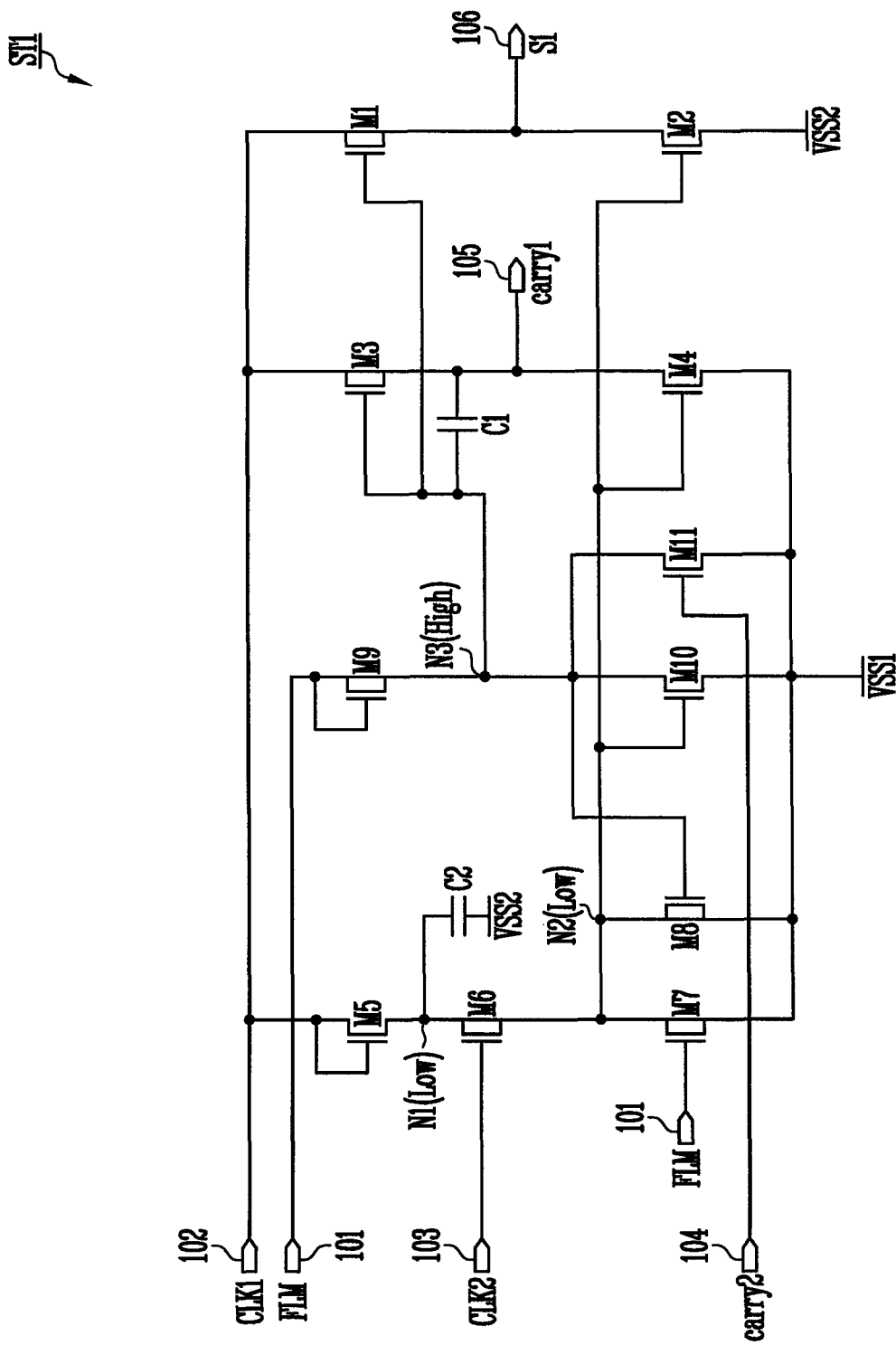
FIGS. 5A to 5E are circuit diagrams illustrating an operating process according to the driving method of FIG. 4.

When the start signal FLM is supplied, the seventh and ninth transistors M7 and M9 are turned on as shown in FIG. 5A. When the seventh transistor M7 is turned on, the voltage of the first power source VSS1 is supplied to the second node N2. When the voltage of the first power source VSS1 is supplied to the second node N2, the tenth, fourth and second transistors M10, M4 and M2 are turned off.

When the ninth transistor M9 is turned on, the voltage of the start signal FLM is supplied to the third node N3. In this case, the voltage of the third node N3 is set to a high voltage (gate-on voltage), and accordingly, the eighth, third and first transistors M8, M3 and M1 are turned on.

When the eighth transistor M8 is turned on, the voltage of the first power source VSS1 is supplied to the second node N2. When the third transistor M3 is turned on, the second input terminal 102 and the first output terminal 105 are electrically coupled to each other. In this case, the first clock signal CLK1 (i.e., a low voltage) is not supplied to the second input terminal 102, and accordingly, the first output terminal 105 maintains the low voltage. When the first transistor M1 is turned on, the second input terminal 102 and the second output terminal 106 are electrically coupled to each other. In this case, the first clock signal CLK1 is not supplied to the second input terminal 102, and accordingly, the second output terminal 106 maintains the low voltage.

Meanwhile, when the second clock signal CLK2 is supplied, the sixth transistor M6 is turned on. When the sixth transistor M6 is turned on, the first and second nodes N1 and N2 are electrically coupled to each other. In this case, the voltage of the first power source VSS1 is stored in the second capacitor C2.

During a second period T2, the first clock signal CLK1 is supplied to the second input terminal 102, and the supply of the start signal FLM to the first input terminal 101 is stopped (e.g., the start signal FLM is at a low level).

Figure 5B:
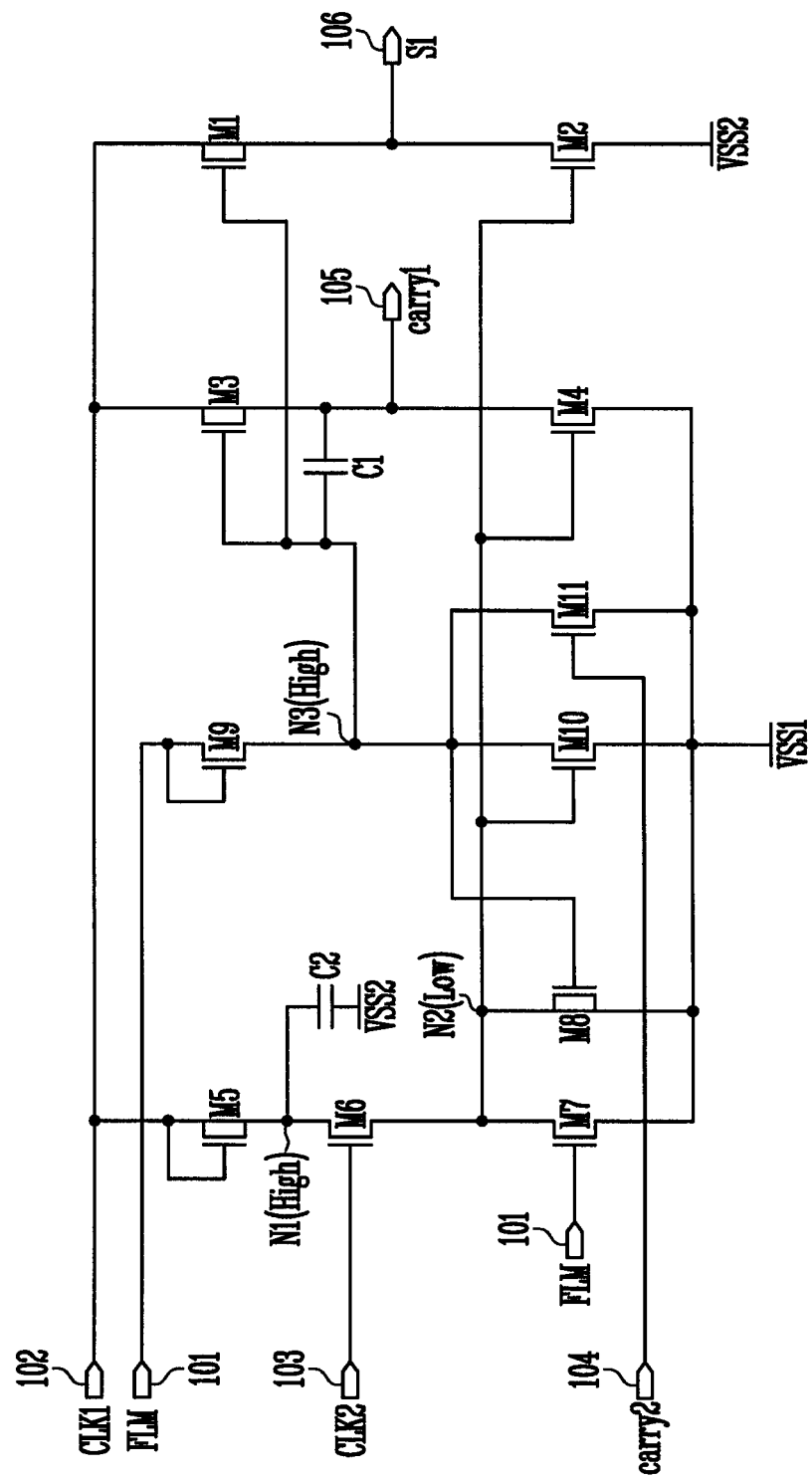

When the start signal FLM is not supplied to the first input terminal 101, the ninth transistor M9 is turned off as shown in FIG. 5B. When the ninth transistor M9 is turned off, the third node N3 is set to a floating state, and maintains the high voltage of the previous period. When the third node N3 maintains the high voltage, the eighth, third and first transistors M8, M3 and M1 maintain the turn-on state.

When the third transistor M3 is set to the turn-on state, the clock signal CLK1 supplied to the second input terminal 102 is supplied to the first output terminal 105. In this case, the voltage of the third node N3 is raised by the coupling of the first capacitor C1, and accordingly, the third transistor M3 stably maintains the turn-on state. The first clock signal CLK1 supplied to the first output terminal 105 is output as a carry signal carry1 to the next stage.

When the first transistor M1 is set to the turn-on state, the first clock signal CLK1 supplied to the second input terminal 102 is supplied to the second output terminal 106. Meanwhile, the voltage of the third node N3 is raised by the coupling of the first capacitor C1, and accordingly, the first transistor M1 stably maintains the turn-on state. The first clock signal CLK1 supplied to the second output terminal 106 is output as a scan signal to the scan line S1.

Additionally, when the first clock signal CLK1 is supplied to the second input terminal 102, the fifth transistor M5 is turned on. When the fifth transistor M5 is turned on, the high voltage is supplied to the first node N1, and the second capacitor C2 stores the high voltage supplied to the first node N1.

Figure 5C:
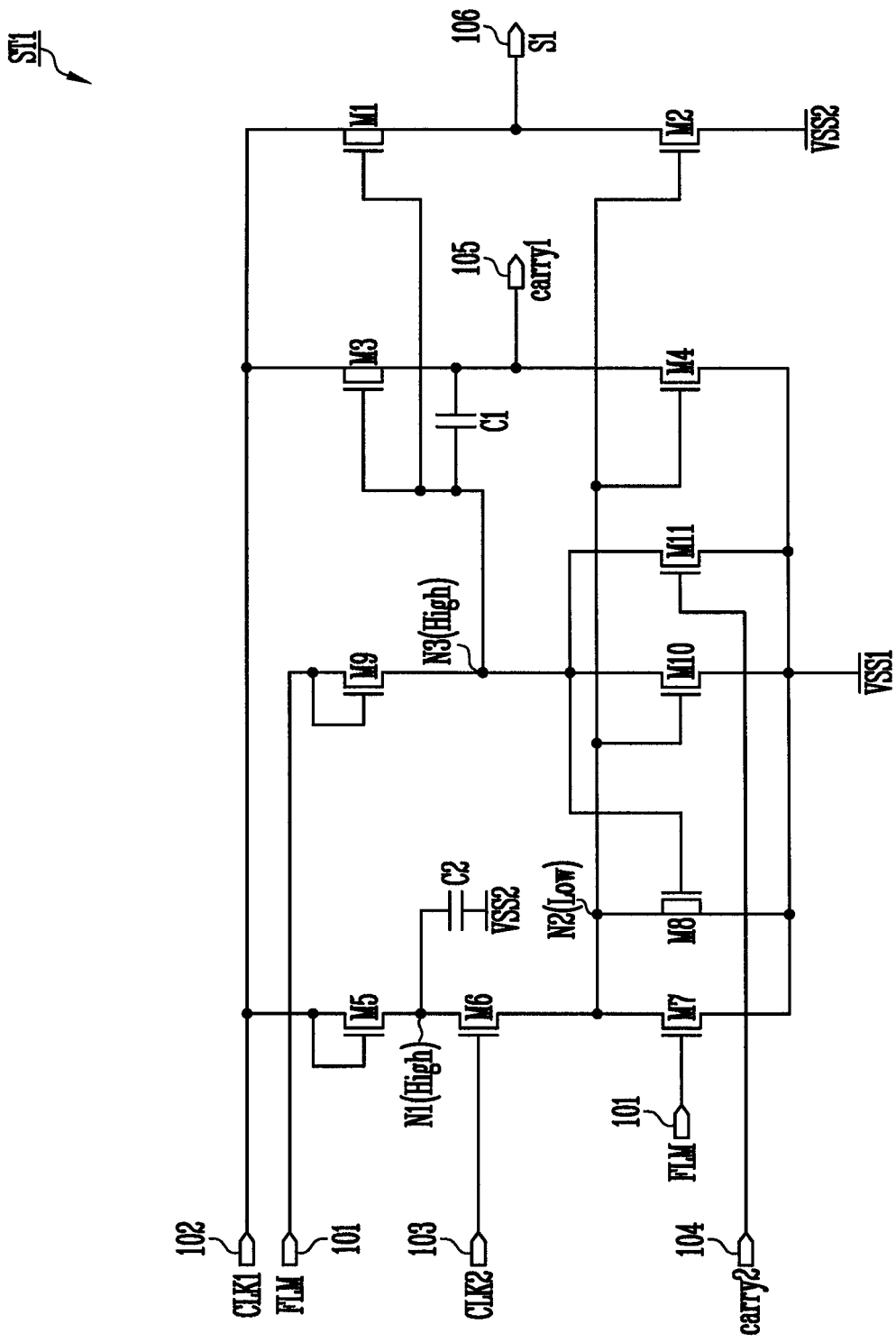

During a third period T3, the supply of the first clock signal CLK1 to the second input terminal 102 is stopped (e.g., the first clock signal CLK1 is at a low level). When the supply of the first clock signal CLK1 to the second input terminal 102 is stopped, the fifth transistor M5 is turned off as shown in FIG. 5C. In this case, the first node N1 maintains the high voltage through the coupling of the second capacitor C2. Meanwhile, when the supply of the first clock signal CLK1 to the second input terminal 102 is stopped, the low voltage is output to the first and second output terminals 105 and 106 by the third and first transistors M3 and M1 which maintain the turn-on state. That is, the supply of the carry signal carry1 and the scan signal is stopped (e.g., the carry signal carry1 is at a low level) during the third period T3.

Figure 5D:
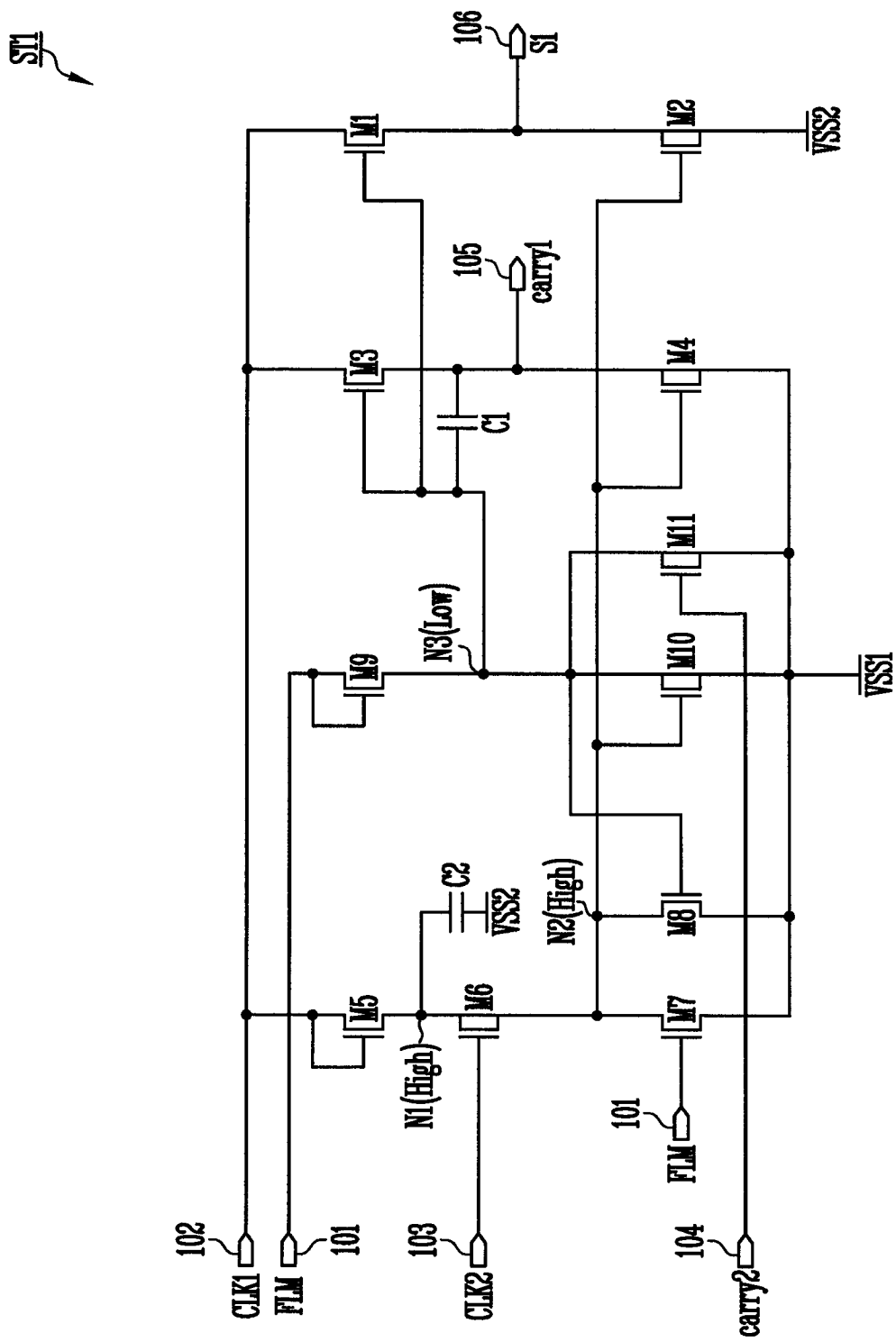

During a fourth period T4, the second clock signal CLK2 is supplied to the third input terminal 103, and a carry signal carry2 of the next stage is supplied to the fourth input terminal 104. When the carry signal carry2 is supplied to the fourth input terminal 104, the eleventh transistor M11 is turned on as shown in FIG. 5D.

When the eleventh transistor M11 is turned on, the voltage of the first power source VSS1 is supplied to the third node N3. When the voltage of the first power source VSS1 is supplied to the third node N3, the eighth, third and first transistors M8, M3 and M1 are turned off.

When the second clock signal CLK2 is supplied to the third input terminal 103, the sixth transistor M6 is turned on. When the sixth transistor M6 is turned on, the high voltage stored in the second capacitor C2 is supplied to the second node N2. When the high voltage is supplied to the second node N2, the tenth, fourth and second transistors are turned on.

When the tenth transistor M10 is turned on, the voltage of the first power source VSS1 is supplied to the third node N3. When the fourth transistor M4 is turned on, the voltage of the first power source VSS1 is supplied to the first output terminal 105. When the second transistor M2 is turned on, the voltage of the second power source VSS2 is supplied to the second output terminal 106.

Figure 5E:
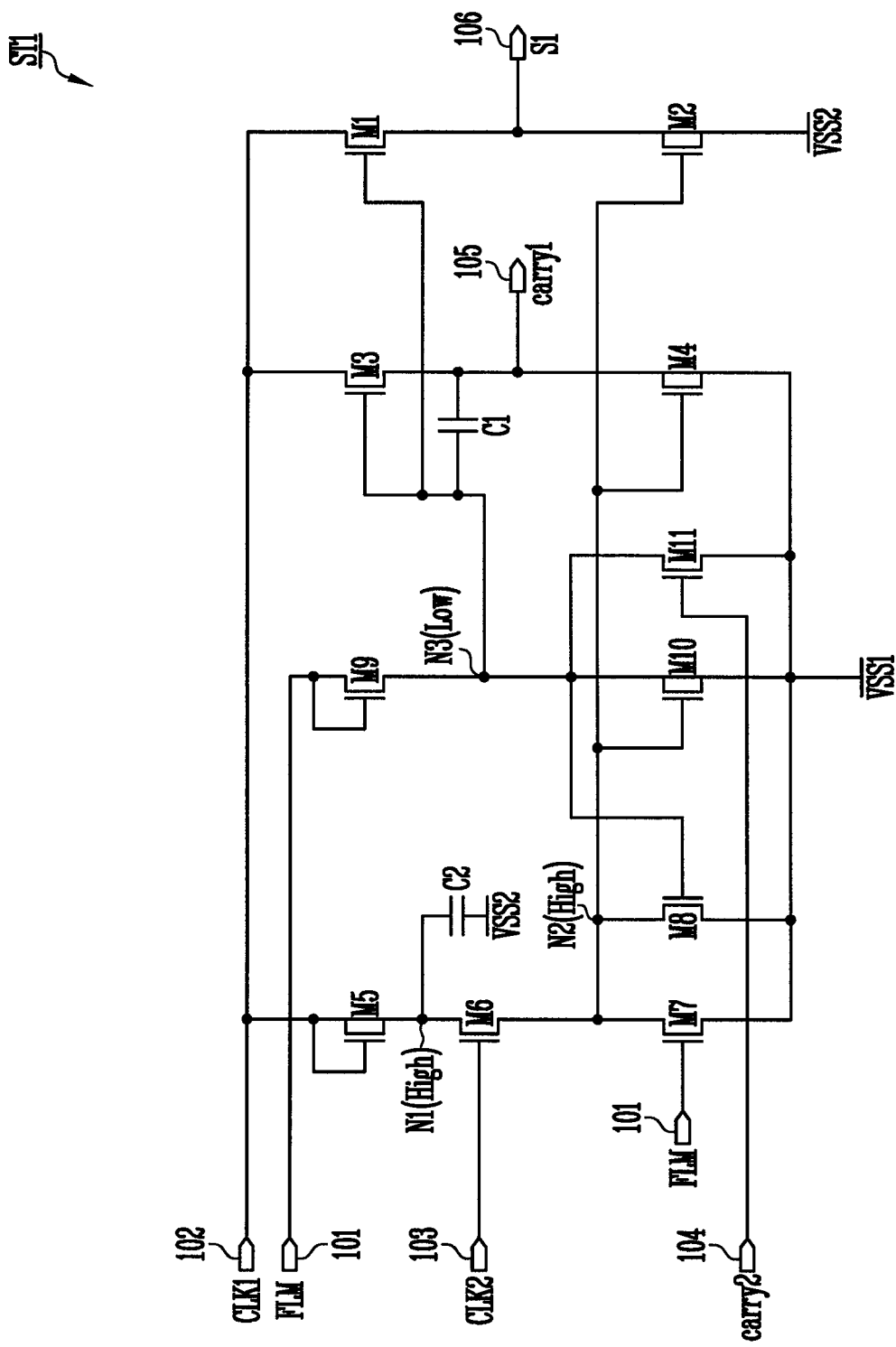

During a fifth period T5, the first clock signal CLK1 is supplied to the second input terminal 102. When the first clock signal CLK1 is supplied to the second input terminal 102, the fifth transistor M5 is turned on as shown in FIG. 5E. When the fifth transistor M5 is turned on, the high voltage is supplied to the first node N1, and the second capacitor C2 stores the high voltage supplied to the first node N1. Meanwhile, the second node N2 maintains the high voltage during the fifth period T5, and accordingly, the tenth, fourth and second transistors M10, M4 and M2 maintain the turn-on state. Subsequently, when the second clock signal CLK2 is supplied to the third input terminal 103, the high voltage stored in the second capacitor C2 is supplied to the second node N2.

For Example, the stage circuits of embodiments according to the present invention progressively supply scan signals to the scan lines S1 to Sn while repeating the aforementioned process. Since the stage circuits of embodiments according to the present invention are driven using the two clock signals CLK1 and CLK2, the number of signal lines can be reduced (e.g. minimized), and accordingly, it is possible to reduce power consumption and the mounting area. Additionally, in embodiments according to the present invention, the second transistor M2 coupled to the scan line can be completely set to the turn-off state, and accordingly, it is possible to improve the reliability of driving. Moreover, in embodiments according to the present invention, the load of the first and second output units 130 and 140 is distributed, and accordingly, it is possible to ensure the reliability of driving.

FIG. 6 is a diagram illustrating a simulation result of the scan driver according to an embodiment of the present invention.

Referring to FIG. 6, the stage circuits of the scan driver of embodiments according to the present invention stably output the scan signals, corresponding to the start signal FLM and the clock signals CLK1 and CLK2. In embodiments according to the present invention, scan signals are supplied at an interval (e.g. a predetermined interval), and accordingly; desired data signals can be stably supplied to the pixels.

By way of summation and review, an organic light emitting display device includes a data driver configured to supply data signals to data lines, a scan driver configured to supply scan signals to scan lines, and a display unit including a plurality of pixels coupled to the scan lines and the data lines.

Pixels included in the display unit are selected when a scan signal is supplied to a scan line, to receive data signals from data lines. The pixels receiving the data signals generate light (e.g. light having a predetermined luminance) corresponding to the data signals, thereby displaying an image.

The scan driver includes stage circuits respectively couple to the scan lines. Each stage circuit includes a plurality of transistors configured to supply scan signals to the scan lines. P-type (e.g., PMOS) or N-type (e.g., NMOS) transistors constituting the stage circuit may be concurrently (e.g. simultaneously) formed with pixels. In this case, it is possible to reduce the manufacturing cost of the organic light emitting display device, etc.

However, in a case where the stage circuit is implemented with N-type transistors, the transistor may not be completely turned off due to the Vth shift of the transistor. For example, when the transistor coupled to the scan line is not completely turned off, the reliability of driving is lowered due to a large amount of leakage current. Additionally, a plurality of signals including three or more clock signals are used in the currently used stage circuit, and therefore, the power consumption of the stage circuit is increased.

In the stage circuit and the scan driver using the same according to embodiments according to the present invention, the transistor coupled to the scan line is completely turned off. Accordingly, it is possible to improve the reliability of driving. Further, in embodiments according to the present invention, the carry signal and the scan signal are generated in different output units. Accordingly, it is possible to distribute the load of the output units. In embodiments according to the present invention, only two clock signals are used, so that it is possible to reduce (e.g. minimize) the number of signal lines, to reduce power consumption of the signal lines and to decrease the mounting area of the signal lines.

Example embodiments have been disclosed herein, and although specific terms are employed, they are used and are to be interpreted in a generic and descriptive sense only and not for purpose of limitation. In some instances, as would be apparent to one of ordinary skill in the art at the time of filing the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and their equivalents.

What is claimed is:

1. A stage circuit comprising:
   a first driver configured to control voltages of first and second nodes, according to a first power source, a start signal or a carry signal of a previous stage supplied to a first input terminal, a first clock signal supplied to a second input terminal, and a second clock signal supplied to a third input terminal;
   a second driver configured to control a voltage of a third node, according to the first power source, the start signal or the carry signal of a previous stage supplied to a first input terminal, a carry signal of a next stage supplied to a fourth input terminal, and the voltage of the second node;

a first output unit configured to output a carry signal to a first output terminal, according to voltages of the second input terminal, the first power source and the second and third nodes; and a second output unit configured to output a scan signal to a second output terminal, according to voltages of a second power source, the second input terminal and the second and third nodes.

2. The stage circuit of claim 1, wherein the first driver, the second driver, the first output unit and the second output unit comprise N-type transistors.

3. The stage circuit of claim 1, wherein the first and second power sources have a gate-off voltage.

4. The stage circuit of claim 3, wherein the second power source has a voltage higher than that of the first power source.

5. The stage circuit of claim 1, wherein the second output unit comprises:
a first transistor coupled between the second input terminal and the second output terminal, the first transistor comprising a gate electrode coupled to the third node; and
a second transistor coupled between the second output terminal and the second power source, the second transistor comprising a gate electrode coupled to the second node.

6. The stage circuit of claim 1, wherein the first output unit comprises:
a third transistor coupled between the second input terminal and the first output terminal, the third transistor comprising a gate electrode coupled to the third node;
a fourth transistor coupled between the first output terminal and the first power source, the fourth transistor comprising a gate electrode coupled to the second node; and
a first capacitor coupled between the third node and the first output terminal.

7. The stage circuit of claim 1, wherein the first driver comprises:
a fifth transistor coupled between the second input terminal and the first node, the fifth transistor comprising a gate electrode coupled to the second input terminal;
a sixth transistor coupled between the first and second nodes, the sixth transistor comprising a gate electrode coupled to the third input terminal;
a seventh transistor coupled between the second node and the first power source, the seventh transistor comprising a gate electrode coupled to the first input terminal;
an eighth transistor coupled between the second node and the first power source, the eighth transistor comprising a gate electrode coupled to the third node; and
a second capacitor coupled between the first node and the second power source.

8. The stage circuit of claim 1, wherein the second driver comprises:
a ninth transistor coupled between the first input terminal and the third node, the ninth transistor comprising a gate electrode coupled to the first input terminal;
a tenth transistor coupled between the third node and the first power source, the tenth transistor comprising a gate electrode coupled to the second node; and
an eleventh transistor coupled between the third node and the first power source, the eleventh transistor comprising a gate electrode coupled to the fourth input terminal.

9. A scan driver comprising:
stage circuits respectively coupled to scan lines to supply scan signals to the scan lines,
wherein each of the stage circuits comprises:
a first driver configured to control voltages of first and second nodes, according to a first power source, a start signal or a carry signal of a previous stage supplied to a first input terminal, a first or second clock signal supplied to a second input terminal, and the second or first clock signal supplied to a third input terminal;

a second driver configured to control a voltage of a third node, according to the first power source, the start signal or the carry signal of a previous stage supplied to a first input terminal, a carry signal of a next stage supplied to a fourth input terminal, and the voltage of the second node;

a first output unit configured to output a carry signal to a first output terminal, according to voltages of the second input terminal, the first power source and the second and third nodes; and a second output unit configured to output a scan signal to a second output terminal, according to voltages of a second power source, the second input terminal and the second and third nodes.

10. The scan driver of claim 9, wherein the first and second clock signals repeat first and second voltages, the second voltage being lower than the first voltage, and the supply period of the second voltage is longer than that of the first voltage.

11. The scan driver of claim 10, wherein the low voltage of the first clock signal is overlapped with the first voltage of the second clock signal.

12. The scan driver of claim 9, wherein the start signal is input to the first input terminal of a first stage circuit, and the carry signal of the previous stage is input to the first input terminal of each of the other stage circuits.

13. The scan driver of claim 12, wherein the start signal is overlapped with one of the first and the second clock signals supplied to the third input terminal.

14. The scan driver of claim 9, wherein the first and second clock signals are supplied to the second and third input terminals of an odd-numbered stage, respectively, and
wherein the second and first clock signals are supplied to the second and third input terminals of an even-numbered stage, respectively.

15. The scan driver of claim 9, wherein the first driver, the second driver, the first output unit and the second output unit comprise N-type transistors.

16. The scan driver of claim 9, wherein the first and second power sources have a gate-off voltage.

17. The scan driver of claim 16, wherein the second power source has a voltage higher than that of the first power source.

18. The scan driver of claim 9, wherein the second output unit comprises:
a first transistor coupled between the second input terminal and the second output terminal, the first transistor comprising a gate electrode coupled to the third node; and
a second transistor coupled between the second output terminal and the second power source, the second transistor comprising a gate electrode coupled to the second node.

19. The scan driver of claim 9, wherein the first output unit comprises:
a third transistor coupled between the second input terminal and the first output terminal, the third transistor comprising a gate electrode coupled to the third node;
a fourth transistor coupled between the first output terminal and the first power source, the fourth transistor comprising a gate electrode coupled to the second node; and
a first capacitor coupled between the third node and the first output terminal.

20. The scan driver of claim 9, wherein the first driver comprises:

a fifth transistor coupled between the second input terminal and the first node, the fifth transistor comprising a gate electrode coupled to the second input terminal;

a sixth transistor coupled between the first and second nodes, the sixth transistor comprising a gate electrode coupled to the third input terminal;

a seventh transistor coupled between the second node and the first power source, the seventh transistor comprising a gate electrode coupled to the first input terminal;

an eighth transistor coupled between the second node and the first power source, the eighth transistor comprising a gate electrode coupled to the third node; and a second capacitor coupled between the first node and the second power source.

21. The scan driver of claim 9, wherein the second driver comprises:

a ninth transistor coupled between the first input terminal and the third node, the ninth transistor comprising a gate electrode coupled to the first input terminal;

a tenth transistor coupled between the third node and the first power source, the tenth transistor comprising a gate electrode coupled to the second node; and an eleventh transistor coupled between the third node and the first power source, the eleventh transistor comprising a gate electrode coupled to the fourth input terminal.

* * * * *